US010228398B2

(12) United States Patent
Dinh

(10) Patent No.: US 10,228,398 B2
(45) Date of Patent: Mar. 12, 2019

(54) SYSTEM AND METHOD FOR MINIMIZING MAGNETIC FIELD EFFECT ON AN ISOLATED MAGNETOMETER

(71) Applicant: Rosemount Aerospace Inc., Burnsville, MN (US)

(72) Inventor: Nghia T. Dinh, Burnsville, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 918 days.

(21) Appl. No.: 14/677,400

(22) Filed: Apr. 2, 2015

(65) Prior Publication Data
US 2019/0037643 A1   Jan. 31, 2019

(51) Int. Cl.
G01R 15/20 (2006.01)
G01R 33/07 (2006.01)
G01R 19/00 (2006.01)

(52) U.S. Cl.
CPC .............. G01R 19/0092 (2013.01)

(58) Field of Classification Search
CPC .. G01R 15/202; G01R 33/07; G01R 19/0092; G01R 19/10
USPC ............... 324/117 H, 76.52, 76.39, 76.11
See application file for complete search history.

(56) References Cited

U.S. PATENT DOCUMENTS

| 2,510,986 | A | 6/1950 | Larkin |
|---|---|---|---|
| 3,284,703 | A | 11/1966 | Brunel |
| 3,323,057 | A | 5/1967 | Haley |
| 4,374,333 | A | 2/1983 | Avery |
| 4,439,732 | A | 3/1984 | Hesterman et al. |
| 4,610,710 | A | 9/1986 | Koontz |
| 4,639,674 | A | 1/1987 | Rippingale |
| 4,646,014 | A | 2/1987 | Eulenberg |
| 5,122,744 | A | 6/1992 | Koch |
| 5,241,270 | A | 8/1993 | Ng |
| 5,489,844 | A | 2/1996 | Preston et al. |
| 5,604,433 | A | 2/1997 | Theus et al. |
| 5,642,045 | A | 6/1997 | Keefe et al. |
| 5,742,128 | A | 4/1998 | Bearce et al. |

(Continued)

FOREIGN PATENT DOCUMENTS

EP          0932831 A1    8/1999
WO     WO 01/77622 A2   10/2001

OTHER PUBLICATIONS

Extended European Search Report, for European Patent Application No. 16163639.4, dated Aug. 10, 2016, 15 pages.

Primary Examiner — Giovanni Astacio-Oquendo
(74) Attorney, Agent, or Firm — Kinney & Lange, P.A.

(57) ABSTRACT

A system for measuring an electrical current to a heater includes an electrical line between a first power source and the heater, a control sensor adjacent to the electrical line, a compensation sensor proximate the control sensor and an operational amplifier electrically connected to the control sensor and the compensation sensor. The control sensor is a Hall effect sensor to measure a first magnetic field induced by the electrical current and an ambient magnetic field and output a resulting first voltage. The compensation sensor is a Hall effect sensor with the same orientation as the control sensor to measure a second magnetic field induced by the ambient magnetic field and output a resulting second voltage. The operation amplifier is able to receive the first voltage and the second voltage and determine the electrical current flowing through the electrical line.

15 Claims, 2 Drawing Sheets

(56) References Cited

U.S. PATENT DOCUMENTS

| | | |
|---|---|---|
| 6,215,296 B1 | 4/2001 | Arnoux et al. |
| 6,466,004 B1 | 10/2002 | Rogers et al. |
| 6,690,155 B2 | 2/2004 | Vig et al. |
| 7,259,546 B1 | 8/2007 | Hastings et al. |
| 7,268,881 B2 | 9/2007 | Larsen et al. |
| 7,279,884 B2 | 10/2007 | Yakymyshyn et al. |
| 7,436,120 B2 | 10/2008 | Buschbeck et al. |
| 7,531,776 B2 | 5/2009 | Koide |
| 8,591,427 B2 | 11/2013 | Zuckerman et al. |
| 8,847,582 B2 | 9/2014 | Shestakov |
| 8,963,535 B1 | 2/2015 | Melanson |
| 8,963,540 B2 | 2/2015 | Reymond et al. |
| 9,910,053 B2 * | 3/2018 | Bakhru .................. G01N 33/86 |
| 2007/0212036 A1 * | 9/2007 | Halsall .................... F24H 1/202 |
| | | 392/451 |
| 2014/0105608 A1 | 4/2014 | Faruque et al. |
| 2014/0117983 A1 | 5/2014 | Rohrer |
| 2014/0263280 A1 * | 9/2014 | Ramacciotti ............ F24H 3/002 |
| | | 219/528 |
| 2014/0292309 A1 | 10/2014 | Kurashima et al. |
| 2014/0320144 A1 * | 10/2014 | Nakaya ................ H01M 10/54 |
| | | 324/434 |
| 2014/0360285 A1 | 12/2014 | Barraco et al. |
| 2015/0059780 A1 * | 3/2015 | Davis .................... A24F 47/008 |
| | | 131/328 |
| 2017/0264110 A1 * | 9/2017 | Toya ..................... H02J 7/0021 |

\* cited by examiner

SYSTEM AND METHOD FOR MINIMIZING MAGNETIC FIELD EFFECT ON AN ISOLATED MAGNETOMETER

BACKGROUND

The present disclosure relates to measurement of current in aerospace applications and, more particularly, to the use of an unshielded Hall Effect sensor to measure the current supplied to a heater on an aircraft or air vehicle (such as a missile or other self-propelled munition).

In aerospace equipment, such as air data probes (e.g., pitot tubes) or total air temperature sensors, there is a need to use heaters to melt ice or prevent ice from forming on these atmospheric probes. Often, the current used to power the heater (called the heater current) is isolated from the current used to power the electronics that adjust/control the dissipation of heat from the heater. Therefore, a system is needed to measure the current supplied to the heater and communicate that measurement to the electronics that adjust/control the heater current.

One system utilizes a magnetometer, such as a Hall Effect sensor, to sense the heater current using the magnetic field created by the current flow through a wire. However, the Hall Effect sensor is sensitive to ambient magnetic fields, such as those created by the Earth, other components on the aerospace vehicle, and equipment used in testing. Typically, high permeability metal is used to encase and shield the magnetometer from the ambient magnetic field to prevent the ambient magnetic field from influencing the magnetometer's measurement of the heater current. Problems arise with the use of a high permeability metal because the metal is heavy and needed to be fastened to a printed wire board (into which the magnetometer is incorporated) via screws and nuts that are inefficient. Because the shielding effect of the metal is directly proportional to the thickness of the metal, the metal needs to be quite thick to shield the magnetometer from the magnetic field that occurs during vibration testing of the system. Increased thickness results in increased weight and a reduction in efficiency. Therefore, there is a need to develop a current measurement system that does not utilize a high permeability metal to shield the magnetometer.

SUMMARY

A system for measuring an electrical current to a heater includes an electrical line between a first power source and the heater, a control sensor adjacent to the electrical line, a compensation sensor proximate the control sensor and an operational amplifier electrically connected to the control sensor and the compensation sensor. The control sensor is a Hall Effect sensor to measure a first magnetic field induced by the electrical current and an ambient magnetic field and output a resulting first voltage. The compensation sensor is a Hall Effect sensor with the same orientation as the control sensor to measure a second magnetic field induced by the ambient magnetic field and output a resulting second voltage. The operation amplifier is able to receive the first voltage and the second voltage and determine the electrical current flowing through the electrical line.

A method of measuring electrical current to a heater on an aerospace vehicle includes measuring a first magnetic field and outputting a corresponding first voltage using a first Hall effect sensor with the first magnetic field having an ambient magnetic field and an induced magnetic field resulting from the electrical current, measuring a second magnetic field and outputting a corresponding second voltage using a second Hall effect sensor having the same orientation as the first Hall effect sensor with the second magnetic field having the ambient magnetic field, communicating a measurement of the first voltage resulting from the first magnetic field and a measurement of the second voltage resulting from the second magnetic field to an operational amplifier, and determining a measurement of the electrical current flowing to the heater using the operational amplifier.

DETAILED DESCRIPTION

An unshielded electrical current flow sensing system is disclosed herein that can be used to measure and control an electrical current (referred to as the heater current) supplied to a heater, which is used to prevent ice from building up on an atmospheric probe (e.g., a pitot tube assembly) on an aerospace vehicle (including manned and unmanned aircrafts as well as guided and unguided projectiles, such as missiles and rockets). The sensing system can include a control sensor, which measures the heater current flowing through the electrical line and an ambient magnetic field; a compensation sensor, which measures only the ambient magnetic field; and an operational amplifier, which receives the measurements from the control sensor and the compensation sensor and determines a measurement of the heater current flowing to the heater. The measurement of the heater current can be communicated to a microcontroller, which adjusts the heater current flowing to the heater based on a variety of factors, including the available current able to be supplied by the aircraft, the heater current being supplied to the heater, the atmospheric conditions experienced by the probe, and so forth. The control sensor and compensation sensors are magnetometers, such as Hall Effect sensors, that measure the surrounding magnetic field and output the reading as a corresponding voltage. Because the Earth and/or other components near the control sensor can influence the magnetic field measured by the control sensor (and create the ambient magnetic field not attributable to the heater current), the compensation sensor is utilized to measure the ambient magnetic field, which is then subtracted from the control sensor measurement (using the operational amplifier) to arrive at a true (net) measurement of the heater current.

The unshielded current flow sensing system has many benefits. The sensing system provides an active method to cancel the influence of the ambient magnetic field on the control sensor. The sensing system enables cancellation of the ambient magnetic field at various altitudes and geographic locations without the need for recalibration of the control sensor. The sensing system can be used to control/adjust the heater to more efficiently prevent ice buildup on the atmospheric probe. The sensing system has a reduced weight as compared to other systems, such as a sensor that includes a heavy metallic cover to shield the sensor from the ambient magnetic field, thereby increasing efficiency and improving vibrational performance of the control sensor during testing.

Figure 1:
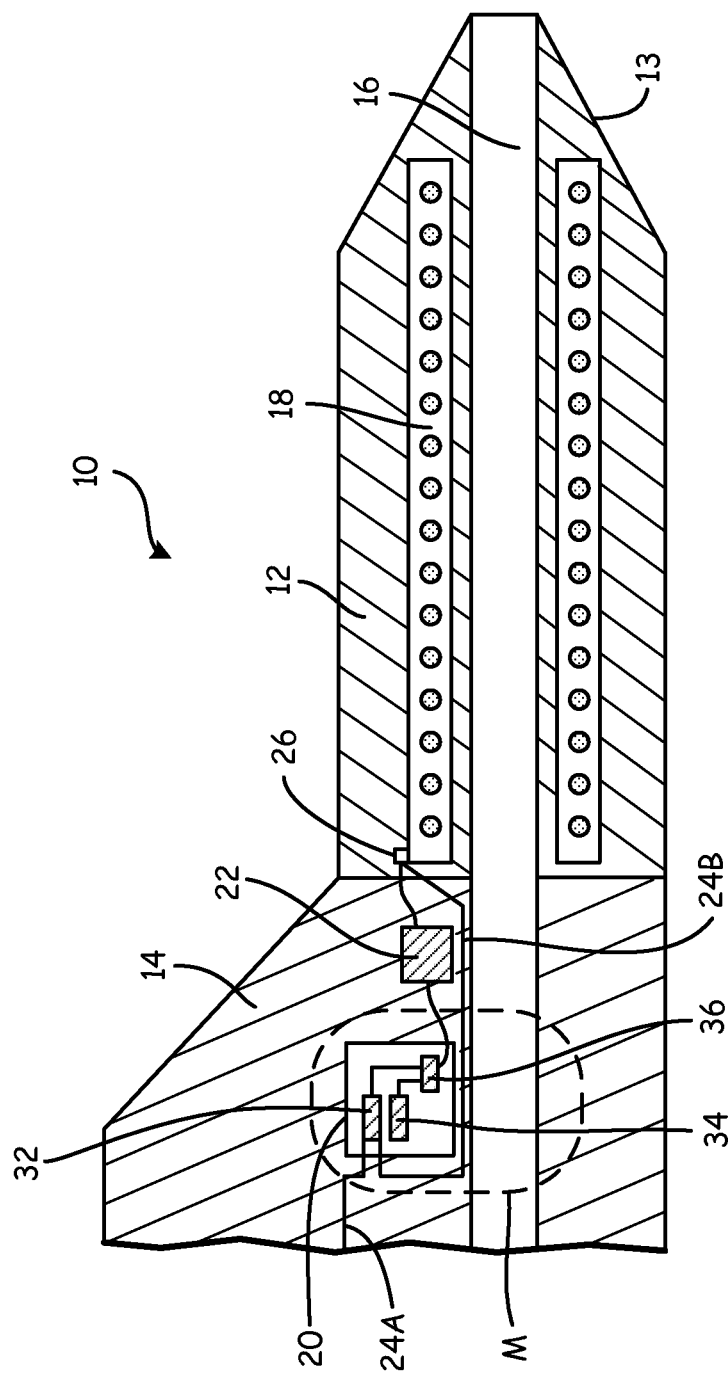
FIG. 1 is a cross-sectional view of an atmospheric probe with a heater and unshielded current flow sensing system.

FIG. 1 is a cross-sectional view of an atmospheric probe with a heater and unshielded flow sensing system. Atmospheric probe 10 includes tube 12 (with tip 13), base 14, and aperture 16 extending through tube 12 and base 14. Within tube 12 is heater 18, while within base 14 is unshielded current flow sensing system 20 (permeated by ambient magnetic field M) with microcontroller 22. Between a power source (not shown) and heater 18 is electrical line 24 (electrical in line 24A and electrical out line 24B), upon which switch 26 is located adjacent to heater 18.

Atmospheric probe 10 can be a pitot tube, total air temperature probe, or another sensor on an aerospace vehicle that aids in measuring the atmospheric conditions experienced by the aerospace vehicle upon which atmospheric probe 10 is located. Atmospheric probe 10 is generally mounted on an exterior surface of the aerospace vehicle with tube 12 extending forward towards the front. Atmospheric probe 10 can be used to measure air pressure (both dynamic and static), air velocity, air temperature, true airspeed, and other atmospheric and motion characteristics. As mentioned above, because atmospheric probe 10 is exposed to atmospheric conditions (which may have a temperature below the freezing temperature of water), ice can develop on and within atmospheric probe 10, leading to incorrect measurements due to blockage of aperture 16. Therefore, it is important to keep atmospheric probe 10 free from ice through the use of heater 18 within atmospheric probe 10.

Tube 12 is a cylindrical component that can extend substantially horizontal to a conical tip 13. Tip 13 of tube 12 can be conical to allow the air to flow around tube 12 more easily, with the center of tip 13 having aperture 16 into which air can enter atmospheric probe 10. Tube 12 can be made from a variety of materials, including a composite material or a metal, such as aluminum. Additionally, tube 12 can be one continuous and monolithic piece with base 14 or can be a number of pieces fastened together. Tube 12 can be hollow (other than a cylinder lining aperture 16 and heater 18) or can include a filler material that is a thermal conductor to allow for the heat to dissipate from heater 18 to the surfaces of tube 12. While FIG. 1 shows tube 12 as a cylinder with conical tip 13, tube 12 can be a larger cone angled towards base 14, have an oval or rectangular cross-section (when viewed from the front), or have other configurations as desired for particular applications.

Base 14 provides structural support to tube 12 and houses unshielded current flow sensing system 20 with microcontroller 22. Base 14 can also house other components of atmospheric probe 10, such as the components necessary in determining atmospheric conditions (not shown in FIG. 1). Base 14 can be linear with tube 12 or can form an L-shape or another shape with tube 12 by being adjacent to a side of tube 12. As with tube 12, base 14 can be one continuous and monolithic piece with tube 12 or a number of pieces fastened together, and base 14 can be made from a variety of materials, including a composite material or a metal, such as aluminum. Base 14 can be hollow (other than a cylinder lining aperture 16 and the electrical components, such as unshielded current flow sensing system 20 with microcontroller 22) or can include a filler material. While FIG. 1 shows unshielded current flow sensing system 20 with microcontroller 22 within base 14, unshielded current flow sensing system 20 and microcontroller 22 can be configured to be within another component, including tube 12 or elsewhere on the aerospace vehicle.

Aperture 16 is a cylindrical opening that extends from tip 13 of tube 12, through tube 12, and into base 14. Aperture 16 allows air (and/or another fluid) to enter atmospheric probe 10 and allows the air/fluid to flow to the atmospheric measurement devices within atmospheric probe 10 and/or other components of the aerospace vehicle. Aperture 16 can have a cylindrical shape with a consistent cross-section or can have a cross-section that varies along tube 12 and base 14, either enlarging, decreasing, or both, depending on the design considerations and requirements of atmospheric probe 10. Aperture 16 can have other components within it, such as measuring and/or sensing devices that allow for the determination of the static air pressure (or other conditions) or elements that manipulate the flow of air/fluid.

Heater 18 is within tube 12 adjacent to aperture 16. Heater 18 can have a cylindrical electrical resistor, such as a heating coil, or another configuration designed to keep the temperature of atmospheric probe 10 above the freezing temperature of water to prevent ice from accumulating within aperture 16 and on the outer surface of tube 12. Heater 18 should be positioned within tube 12 adjacent to aperture 16 to provide sufficient heat from tip 13 of tube 12 to base 14 and the atmospheric measurement devices. Heater 18 can be configured to continuously provide heat to atmospheric probe 10 at a constant rate, can be cycled on and off, or can have various heat dissipation levels that are cycled through or adjusted depending on the air temperature, the amount of heater current able to be supplied by the aircraft, or other factors (as will be discussed below with regards to FIG. 2). Heater 18 is supplied with the heater current by electrical line 24, with electrical in line 24A running from a power source located elsewhere on the aerospace vehicle to unshielded current flow sensing system 20 and electrical out line 24B running from unshielded current flow sensing system 20 to heater 18.

Unshielded current flow sensing system 20 (also referred to as current sensing system or current measuring system) is within base 14 near heater 18 and measures the amount of electrical current (the heater current) flowing through electrical line 24 to power heater 18. As mentioned above and will be described in greater detail with regards to FIG. 2, unshielded current flow sensing system 20 includes a number of electrical components (control sensor 32, compensation sensor 34, and operational amplifier 36) that together measure the heater current flowing through electrical line 24 to heater 18 and communicate that information to microcontroller 22. Unshielded current flow sensing system 20 can be contained within an electrical box; which can be placed within base 14 (as shown in FIG. 1), tube 12, or another component of the aerospace vehicle; but unshielded current flow sensing system 20 should be in electrical communication with electrical line 24 (via electrical in line 24A and electrical out line 24B in FIG. 1) and microcontroller 22. Electrical in line 24A should electrically connect the power source to unshielded current flow sensing system 20 and electrical out line 24B should electrically connect unshielded current flow sensing system 20 to heater 18 so that the heater current flowing to heater 18 is first routed through unshielded current flow sensing system 20 so that unshielded current flow sensing system 20 can measure the heater current flowing to heater 18. Unshielded current flow sensing system 20 is also electrically connected to a power source (not shown), which supplies power to the various components of unshielded current flow sensing system 20.

As will be discussed in greater detail with regards to FIG. 2, unshielded current flow sensing system 20 is surrounded by ambient magnetic field M, which is caused by the magnetic field created by the Earth and/or other components on the aerospace vehicle (permanent magnets, electromagnets or other electrical devices, etc.). Ambient magnetic field M causes inaccuracies in the measurement of the heater current and the cancellation of ambient magnetic field M in the determination of the heater current is an important aspect of unshielded current flow sensing system 20.

Microcontroller 22 is within base 14 and in communication with unshielded current flow sensing system 20. Microcontroller 22 receives an input from unshielded current flow sensing system 20 of the determination of the heater current flowing through electrical line 24 and adjusts the heater current using switch 26 to control the heat dissipated by heater 18 to atmospheric probe 10. Microcontroller 22 can be positioned within base 14 (as shown in FIG. 1), tube 12, or another component of the aerospace vehicle. Additionally, microcontroller 22 can be within an electrical box alone or along with unshielded current flow sensing system 20. Microcontroller 22 is also electrically connected to a power source (not shown), which supplies power to microcontroller 22.

Figure 2:
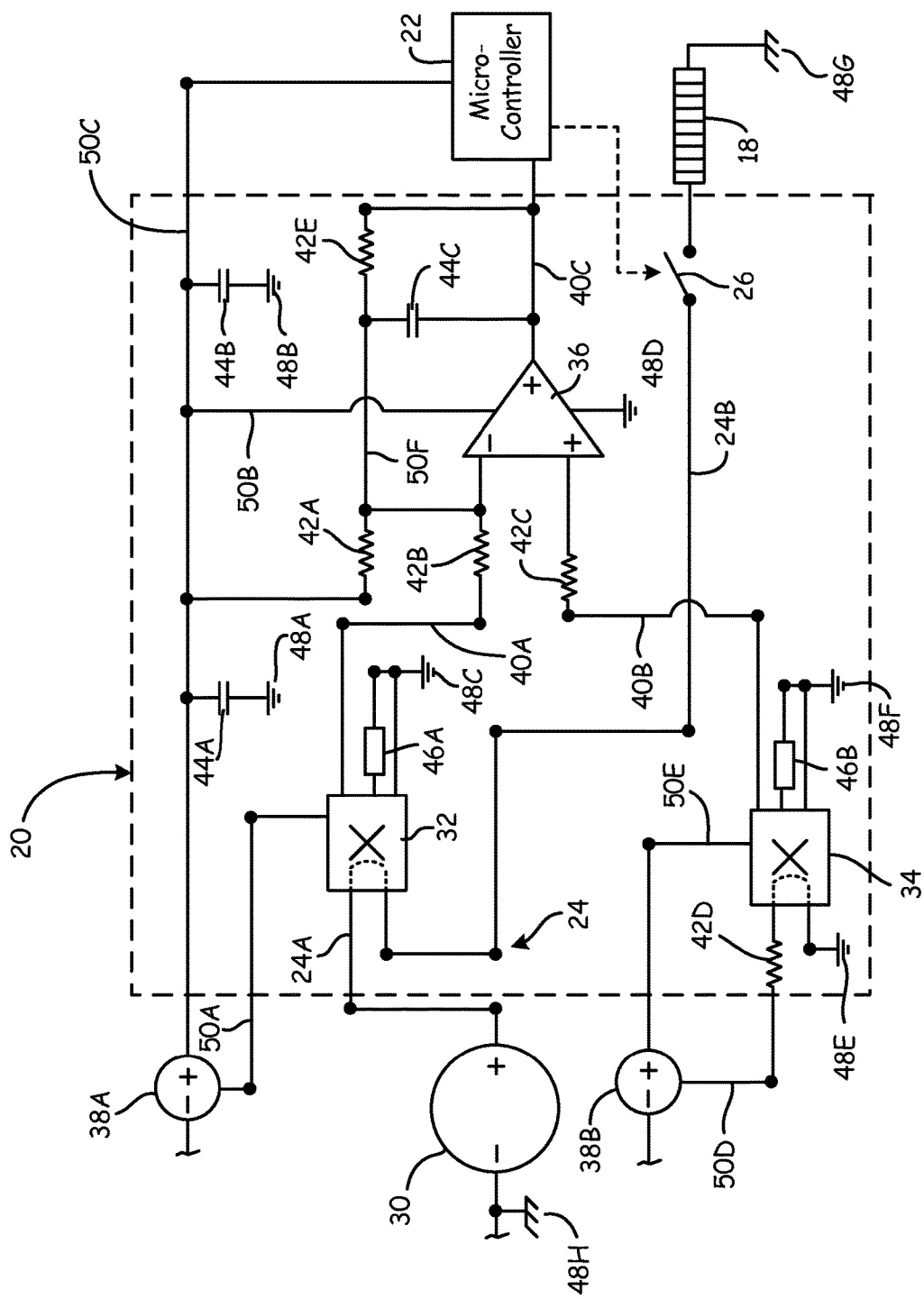
FIG. 2 is a schematic showing an unshielded current flow sensing system.

FIG. 2 is a schematic showing unshielded current flow sensing system 20. Unshielded current flow sensing system 20 includes control sensor 32, compensation sensor 34, operational amplifier 36, control connector line 40A, compensation connector line 40B, op amp connector line 40C, a plurality of resistors 42A-42E, a plurality of capacitors 44A-44C, filters 46A and 46B, a plurality of ground connections 48A-48F, and feedback line 50F. FIG. 2 also shows heater 18 (with ground connection 48G), microcontroller 22, electrical line 24 (with electrical in line 24A and electrical out line 24B), switch 26, heater power source 30 (with ground connection 48H), secondary power sources 38A and 38B, and power connector lines 50A-50E. It should be noted that FIG. 2 is a schematic of unshielded current flow sensing system 20 and the location of components in relation to each other is not necessarily representative of the spatial arrangement of atmospheric probe 10 and unshielded current flow sensing system 20.

Heater power source 30 supplies the heater current to heater 18 through electrical line 24 (electrical in line 24A and electrical out line 24B) to power heater 18. The heater current supplied by heater power source 30 is routed through control sensor 32 for measurement of the heater current. The heater current supplied to heater 18 and the measured current supplied to control sensor 32 are equal (there is no current loss across control sensor 32 between electrical in line 24A and electrical out line 24B) so that the measurement by control sensor 32 is an accurate representation of the heater current supplied to heater 18 by heater power source 30. Heater power source 30 can be any power source, including an auxiliary power unit (APU) of an aerospace vehicle. As will be discussed below, the heater current supplied to heater 18 by heater power source 30 may not be constant and can vary depending on the flight status of the aerospace vehicle (which affects the amount of electricity available to be supplied to heater 18). Heater power source 30 can be connected to ground connection 48H, which can be the same ground as ground connection 48G but may be a different ground connection than the plurality of ground connections 48A-48F present throughout unshielded current flow sensor system 20 to maintain electrical isolation between heater power source 30 (and heater 18) and unshielded current flow sensor system 20.

Electrical in line 24A runs between heater power source 30 and control sensor 32 and electrical out line 24B runs between control sensor 32 and heater 18 to supply the heater current first to control sensor 32 for heater current flow measurement and then to heater 18 for power. Electrical in line 24A and electrical out line 24B can each be electrically connected to at least one port/pin on control sensor 32 to allow the heater current to flow through control sensor 32.

Control sensor 32 is a magnetometer, such as a Hall Effect sensor, that measures the magnetic field present around control sensor 32 and outputs the measurement as an electrical current (voltage) to operational amplifier 36. The magnetic field sensed by control sensor 32 includes the magnetic field induced by the heater current flowing through electrical line 24 and ambient magnetic field M (see FIG. 1), which is the magnetic field created by the Earth and/or other components on the aerospace vehicle (permanent magnets, electromagnets or other electrical devices, etc.).

Generally, control sensor 32 can have a number of ports/pins through which inputs and outputs can connect to control sensor 32, but other configurations of control sensor 32 can have less or no ports/pins and can incorporate within control sensor 32 a variety of electrical devices, such as capacitors, resistors, filters, amplifiers, transducers, connections to ground, etc. Electrical in line 24A can be electrically connected to control sensor 32 through at least one port/pin, and electrical out line 24B can be electrically connected to control sensor 32 through at least one port/pin. Control sensor 32 is powered by secondary power source 38A (which can be connected to one port/pin). Secondary power source 38A is supplied by the aerospace vehicle and likely is not the same power source as heater power source 30 so as to maintain electrical isolation between unshielded current flow sensing system 20 and heater 18. The measurement of the magnetic field around control sensor 32 is outputted as an electrical current through control connector line 40A to operational amplifier 36. Control connector line 40A is electrically connected to control sensor 32 at one port/pin. Optionally connected at another port/pin or included within control sensor 32 is filter 46A, which can include a capacitor and be suited to perform signal processing functions, such as removing unwanted frequency components, enhance wanted frequency components, or both to the electrical current (signal) being outputted from control sensor 32 to operational amplifier 36. Control sensor 32 can also be connected directly to ground connection 48C at one port/pin.

Compensation sensor 34 is a magnetometer, such as a Hall Effect sensor, that functions very similarly to control sensor 32 by measuring the magnetic field present around compensation sensor 34 and outputting the measurement as an electrical current (voltage) to operational amplifier 36. However, compensation sensor 34 is different from control sensor 32 in that compensation sensor 34 is not electrically connected to heater power source 30 (through electrical line 24) and therefore does not measure a magnetic field induced by the heater current flowing through electrical line 24. Rather, compensation sensor 34 measures only ambient magnetic field M and communicates that measurement as an electrical current through compensation connector line 40B to operational amplifier 36.

Generally, like control sensor 32, compensation sensor 34 can have a number of ports/pins through which inputs and outputs can connect to compensation sensor 34, but other configurations of compensation sensor 34 can have less or no ports/pins and can incorporate within compensation sensor 34 a variety of electrical devices, such as capacitors, resistors, filters, amplifiers, transducers, connections to ground, etc. Compensation sensor 34 is powered by secondary power source 38B (which can be connected to one port/pin). Secondary power source 38B is supplied by the aerospace vehicle and likely is not the same power source as heater power source 30 so as to maintain electrical isolation between unshielded current flow sensing system 20 and heater 18. However, secondary power source 38A and 38B can be the same power source, for electrical isolation is not necessary between control sensor 32 and compensation sensor 34. Dissimilar to control sensor 32, compensation sensor 34 is not electrically connected to heater power source 30 in order to measure the heater current going to heater 18, but rather compensation sensor 34 is either not connected to an electrical inlet/outlet to measure an electrical current or, as shown in FIG. 2, is connected to secondary power source 38B at an input (with resistor 42D therebetween) with ground connection 48E at an output. Compensation sensor 34 can be connected at an input to secondary power source 38B so that secondary power source 38B supplies a minimal electrical current for measurement to compensation sensor 34. The minimal electrical current can be useful in troubleshooting compensation sensor 34 because if compensation sensor 34 outputs a measurement of zero, malfunction of the compensation sensor 34 can more easily be determined. The minimal electrical current supplied to compensation sensor is then outputted to ground connection 48E.

The measurement of ambient magnetic field M around compensation sensor 34 is outputted as an electrical current through compensation connector line 40B to operational amplifier 36. Compensation connector line 40B can be electrically connected to compensation sensor 34 at one port/pin. Optionally connected at another port/pin or included within compensation sensor is filter 46B, which can include a capacitor and be suited to perform signal processing functions, such as removing unwanted frequency components, enhance wanted frequency components, or both to the electrical current (signal) being outputted from compensation sensor 34 to operational amplifier 36. Compensation sensor 34 can also be connected directly to ground connection 48F at one port/pin.

Because the electrical current induced by ambient magnetic field M in both control sensor 32 and compensation sensor 34 is positional dependent (both orientation and location dependent), control sensor 32 and compensation sensor 34 should be similarly oriented so that ambient magnetic field M caused by the Earth's magnetic field influences control sensor 32 and compensation sensor 34 equally. Additionally, control sensor 32 and compensation sensor 34 should be located sufficiently close to one another so that ambient magnetic field M caused by other components on the aerospace vehicle influence control sensor 32 and compensation sensor 34 equally. However, compensation sensor 34 should not be so close to control sensor 32 so as to be influenced by the magnetic field induced by heater current flowing through electrical line 24.

Secondary power source 38A supplies power to control sensor 32, operational amplifier 36, and microcontroller 22 through power connector lines 50A, 50B, and 50C, respectively. Power connector lines 50A, 50B, and 50C and feedback line 50F include various resistors 42A and 42E; capacitors 44A, 44B, and 44C; and ground connections 48A and 48B to manipulate the electrical current coming from secondary power source 38A to ensure unshielded current flow sensing system 20 is able to work properly and is within acceptable limits. While secondary power source 38A is shown in FIG. 2 as providing power to control sensor 32, operation amplifier 36, and microcontroller 22, unshielded current flow sensing system 20 can be configures such that one or a number of other power sources supply power to these components, such as secondary power sources 38A and 38B being one power source that supplies power to all components of unshielded current flow sensing system 20 and is electrically isolated from heater 18 and heater power source 30.

Operational amplifier 36 (also referred to as op amp) is electrically connected to control sensor 32 through control connector line 40A and to compensation sensor 34 through compensation connector line 40B. Operational amplifier 36 operates as a summing operational amplifier, with control connector line 40A connected to an inverting terminal and compensation connector line 40B connected to a noninverting terminal. After biasing the electrical currents through control connector line 40A and through compensation line 40B (the biasing is at least in part achieved by resistor 42A), operational amplifier 36 determines the (net) heater current flowing through electrical line 24 to heater 18 by canceling out ambient magnetic field M. Ambient magnetic field M is canceled out by operational amplifier 36 by subtracting the electrical current induced in compensation sensor 34 by ambient magnetic field M from the electrical current induced in control sensor 32 by the heater current flowing through electrical line 24 and ambient magnetic field M. The resulting electrical current outputted by operational amplifier 36 represents only the heater current. The resulting electrical current is outputted from operational amplifier 36 to microcontroller 22 through op amp connector line 40C.

Operational amplifier 36 is supplied with power by secondary power source 38A and is connected to ground connection 48D, but operational amplifier 36 can have other configurations. Operational amplifier 36 can include various internal frequency and/or current manipulation components, including components that introduce gain to the resulting electrical current.

As mentioned above, the resulting electrical current, which is representative of the heater current, is communicated to microcontroller 22 through op amp connector line 40C. Microcontroller 22 can be a microprocessor that is in communication directly with electrical out line 24B, switch 26 on electrical in line 24B, and/or heater 18 to regulate the heater current. Because microcontroller 22 knows the amount of the heater current conveyed to heater 18, microcontroller 22 knows the heat being dissipated by heater 18 and can vary the heat being dissipated by adjusting the heater current through the use of switch 26, which accepts instruction from microcontroller 22 and adjusts the heater current flowing through electrical line 24 to heater 18. The adjusted heater current is then measured by unshielded current flow sensing system 20 and communicated to microcontroller 22, which then can re-adjust the heater current if needed. Microcontroller 22 can adjust the heater current/heat dissipated by heater 18 depending on various factors, including an amount of electrical current available to heater 18 (which is dictated by the aerospace vehicle computer and electrical systems and may depend on flight procedures), a present amount of heater current being supplied to heater 18, a temperature of atmospheric probe 10, and/or a buildup of ice on atmospheric probe 10. Microcontroller 22 can also adjust the heater current on a cycle that is dependent on flight time or aerospace vehicle location.

Heater 18 dissipates heat to atmospheric probe 10 to prevent the buildup of ice. Heater 18 is supplied power (the heater current) from heater power source 30 through electrical line 24 (through electrical in line 24A and electrical out line 24B). As with most components of unshielded current flow sensing system 20, which are connected to one of a plurality of ground connections 48A-48F, heater 18 is connected to ground connection 48G, which can be the same ground as ground connection 48H but may be a different ground connection than the plurality of ground connections 48A-48F present throughout unshielded current flow sensor system 20 to maintain electrical isolation between and heater 18 (and heater power source 30) and unshielded current flow sensor system 20.

The heater current supplied by heater power source 30 is often part of a different electrical system than the current supplied by secondary power sources 38A and 38B to the other components of unshielded current flow sensing system 20, creating electrical isolation between the heater current and unshielded current flow sensing system 20, which measures the heater current, and microcontroller 22, which adjusts the heater current. Determination of the heater current is accomplished through the use of unshielded current flow sensing system 20, which includes (among other components) control sensor 32, compensation sensor 34, and operational amplifier 36. The determination of the heater current is then communicated to microcontroller 22, which utilizes that information to adjust the heater current being supplied to heater 18 to increase efficiency while ensuring atmospheric probe 10 remains free from ice. The determination of the heater current is performed without the need for a heavy metallic cover surrounding control sensor 32 to shield control sensor 32 from ambient magnetic field M that influences the sensing of the heater current by control sensor 32. Rather than using a metallic shield, control sensor 32 measures the present magnetic field, which includes the magnetic field induced by the heater current and ambient magnetic field M, and compensation sensor 34 measures ambient magnetic field M. These measurements are communicated to operational amplifier 36, which determines the measurement of the heater current by subtracting the measurement taken by compensation sensor 34 from the measurement taken by control sensor 32.

Unshielded current flow sensing system 20 has many benefits. Unshielded current flow sensing system 20 provides an active method to cancel the influence of ambient magnetic field M on control sensor 32. Unshielded current flow sensing system 20 enables cancellation of ambient magnetic field M at various altitudes and geographic locations without the need for recalibration of control sensor 20. Unshielded current flow sensing system 20 can be used to control/adjust heater 18 to more efficiently prevent ice buildup on atmospheric probe 10. Unshielded current flow sensing system 20 has a reduced weight as compared to other systems, such as a system with a sensor that includes a heavy metallic cover to shield a current flow sensor from ambient magnetic field M, thereby increasing efficiency and improving vibrational performance of control sensor 32 during testing, which imparts a large magnetic field on unshielded current flow sensing system 20.

DISCUSSION OF POSSIBLE EMBODIMENTS

The following are non-exclusive descriptions of possible embodiments of the present invention.

A system for measuring an electrical current to a heater includes an electrical line between a first power source and the heater, a control sensor adjacent to the electrical line, a compensation sensor proximate the control sensor and an operational amplifier electrically connected to the control sensor and the compensation sensor. The control sensor is a Hall Effect sensor to measure a first magnetic field induced by the electrical current and an ambient magnetic field and output a resulting first voltage. The compensation sensor is a Hall Effect sensor with the same orientation as the control sensor to measure a second magnetic field induced by the ambient magnetic field and output a resulting second voltage. The operation amplifier is able to receive the first voltage and the second voltage and determine the electrical current flowing through the electrical line.

The system of the preceding paragraph can optionally include, additionally and/or alternatively, any one or more of the following features, configurations and/or additional components:

An output of the control sensor is connected to an inverting terminal of the operational amplifier and an output of the compensation sensor is connected to a noninverting terminal of the operational amplifier so that the operational amplifier determines the electrical current flowing through the electrical line by subtracting a measurement of the second voltage from a measurement of the first voltage.

A microcontroller electrically connected to an output of the operational amplifier, the microcontroller able to regulate the electrical current flowing through the electrical line to the heater.

The microcontroller varies the electrical current flowing to the heater depending on the electrical current determined by the operational amplifier and the amount of electrical current needed by the heater to melt ice or prevent ice from accumulating.

The microcontroller varies the electrical current flowing to the heater depending on an available electrical current supply.

A switch located adjacent to the electrical line and in communication with the microcontroller such that the switch is able to adjust the electrical current flowing through the electrical line to the heater depending on instruction from the microcontroller.

The operational amplifier is configured as an inverting operational amplifier.

The heater provides heat to melt ice or prevent ice from accumulating on an aerospace vehicle probe that is exposed to atmospheric conditions.

A second power source connected to the control sensor and a third power source connected to the compensation sensor.

The compensation sensor is located sufficiently near the control sensor so that both the control sensor and the compensation sensor experience the same ambient magnetic field.

The compensation sensor and the control sensor are oriented in the same direction so that the ambient magnetic field induces an equal voltage in the compensation sensor and the control sensor.

A method of measuring electrical current to a heater on an aircraft includes measuring a first magnetic field and outputting a corresponding first voltage using a first Hall Effect sensor with the first magnetic field having an ambient magnetic field and an induced magnetic field resulting from the electrical current, measuring a second magnetic field and outputting a corresponding second voltage using a second Hall Effect sensor having the same orientation as the first Hall Effect sensor with the second magnetic field having the ambient magnetic field, communicating a measurement of the first voltage resulting from the first magnetic field and a measurement of the second voltage resulting from the second magnetic field to an operational amplifier, and determining a measurement of the electrical current flowing to the heater using the operational amplifier.

The system of the preceding paragraph can optionally include, additionally and/or alternatively, any one or more of the following features, configurations, steps, and/or additional components:

Communicating the measurement of the electrical current to a microcontroller.

Adjusting the electrical current flowing to the heater using a switch controlled by the microcontroller.

The electrical current is adjusted depending on an available electrical current supply.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A system for measuring an electrical current to a heater, the system comprising:
    an electrical line between a first power source and the heater;
    a control sensor adjacent to the electrical line, the control sensor being a Hall Effect sensor to measure a first magnetic field induced by the electrical current and an ambient magnetic field and output a resulting first voltage;
    a compensation sensor proximate the control sensor, the compensation sensor being a Hall effect sensor with the same orientation as the control sensor to measure a second magnetic field induced by the ambient magnetic field and output a resulting second voltage; and
    an operational amplifier electrically connected to the control sensor and the compensation sensor, the operation amplifier able to receive the first voltage and the second voltage and determine the electrical current flowing through the electrical line.

2. The system of claim 1, wherein an output of the control sensor is connected to an inverting terminal of the operational amplifier and an output of the compensation sensor is connected to a noninverting terminal of the operational amplifier so that the operational amplifier determines the electrical current flowing through the electrical line by subtracting a measurement of the second voltage from a measurement of the first voltage.

3. The system of claim 1, further comprising:
    a microcontroller electrically connected to an output of the operational amplifier, the microcontroller able to regulate the electrical current flowing through the electrical line to the heater.

4. The system of claim 3, wherein the microcontroller varies the electrical current flowing to the heater depending on the electrical current determined by the operational amplifier and the amount of electrical current needed by the heater to melt ice or prevent ice from accumulating.

5. The system of claim 3, wherein the microcontroller varies the electrical current flowing to the heater depending on an available electrical current supply.

6. The system of claim 1, further comprising:
    a switch located adjacent to the electrical line and in communication with the microcontroller such that the switch is able to adjust the electrical current flowing through the electrical line to the heater depending on instruction from the microcontroller.

7. The system of claim 1, wherein the operational amplifier is configured as an inverting operational amplifier.

8. The system of claim 1, wherein the heater provides heat to melt ice or prevent ice from accumulating on an aerospace vehicle probe that is exposed to atmospheric conditions.

9. The system of claim 1, further comprising:
    a second power source connected to the control sensor; and
    a third power source connected to the compensation sensor.

10. The system of claim 1, wherein the compensation sensor is located sufficiently near the control sensor so that both the control sensor and the compensation sensor experience the same ambient magnetic field.

11. The system of claim 1, wherein the compensation sensor and the control sensor are oriented in the same direction so that the ambient magnetic field induces an equal voltage in the compensation sensor and the control sensor.

12. A method of measuring electrical current to a heater on an aerospace vehicle, the method comprising:
    measuring a first magnetic field and outputting a corresponding first voltage using a first Hall Effect sensor, the first magnetic field includes an ambient magnetic field and an induced magnetic field resulting from the electrical current;
    measuring a second magnetic field and outputting a corresponding second voltage using a second Hall Effect sensor having the same orientation as the first Hall Effect sensor, the second magnetic field includes the ambient magnetic field;
    communicating, by the first Hall Effect sensor, a measurement of the first voltage resulting from the first magnetic field and, by the second Hall effect sensor, a measurement of the second voltage resulting from the second magnetic field to an operational amplifier; and
    determining a measurement of the electrical current flowing to the heater using the operational amplifier.

13. The method of claim 12, further comprising:
    communicating the measurement of the electrical current to a microcontroller.

14. The method of claim 13, further comprising:
    adjusting the electrical current flowing to the heater using a switch controlled by the microcontroller.

15. The method of claim 14, wherein the electrical current is adjusted depending on an available electrical current supply.

* * * * *